United States Patent
Kasai et al.

(10) Patent No.: US 7,816,788 B2
(45) Date of Patent: Oct. 19, 2010

(54) STRUCTURE, METHOD AND SYSTEM FOR ASSESSING BONDING OF ELECTRODES IN FCB PACKAGING

(75) Inventors: Junichi Kasai, Kanagawa (JP); Junji Tanaka, Kanagawa (JP); Naomi Masuda, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 215 days.

(21) Appl. No.: 12/122,556

(22) Filed: May 16, 2008

(65) Prior Publication Data

US 2008/0303144 A1 Dec. 11, 2008

(30) Foreign Application Priority Data

May 16, 2007 (JP) ............................... 2007-130143

(51) Int. Cl.
- H01L 23/52 (2006.01)
- H01L 23/48 (2006.01)
- H01L 29/40 (2006.01)

(52) U.S. Cl. .................. 257/739; 257/E23.02; 257/737; 257/781; 257/786; 438/613

(58) Field of Classification Search ............ 257/E21.53, 257/E23.023, E23.02, 737–739, 773–776, 257/778, 780, 781, 786; 228/9; 438/15, 438/613

See application file for complete search history.

(56) References Cited

U.S. PATENT DOCUMENTS

| | | | |
|---|---|---|---|
| 5,062,127 A * | 10/1991 | Sayama et al. ................. | 378/45 |
| 5,214,308 A * | 5/1993 | Nishiguchi et al. .......... | 257/692 |
| 5,381,307 A * | 1/1995 | Hertz et al. .................. | 361/767 |
| 5,493,594 A * | 2/1996 | Hamada et al. ............... | 378/34 |
| 5,641,946 A * | 6/1997 | Shim, II ..................... | 174/261 |
| 5,796,169 A * | 8/1998 | Dockerty et al. ............ | 257/780 |
| 5,811,351 A * | 9/1998 | Kawakita et al. ............ | 438/613 |
| 5,828,128 A * | 10/1998 | Higashiguchi et al. ...... | 257/738 |
| 5,856,699 A * | 1/1999 | Hayashi et al. ............. | 257/433 |
| 5,905,772 A * | 5/1999 | Rutten et al. ............... | 378/98.8 |
| 6,177,682 B1 * | 1/2001 | Bartulovic et al. ..... | 250/559.44 |
| 6,222,277 B1 * | 4/2001 | Downes ...................... | 257/778 |
| 6,316,735 B1 * | 11/2001 | Higashiguchi .............. | 174/260 |
| 6,346,679 B1 * | 2/2002 | Nakamura .................. | 174/260 |
| 6,410,861 B1 * | 6/2002 | Huang et al. ................ | 174/260 |
| 6,429,387 B1 * | 8/2002 | Kuribayashi et al. ........ | 174/261 |
| 6,858,941 B2 * | 2/2005 | Ference et al. ............. | 257/781 |
| 6,927,491 B1 * | 8/2005 | Yamada ..................... | 257/737 |
| 6,972,494 B1 * | 12/2005 | Addinall et al. ............. | 257/778 |
| 7,084,500 B2 * | 8/2006 | Swnson et al. ............. | 257/738 |
| 7,180,183 B2 * | 2/2007 | Tsai et al. .................. | 257/737 |
| 7,368,806 B2 * | 5/2008 | Liu et al. .................... | 257/676 |
| 7,564,130 B1 * | 7/2009 | Li .............................. | 257/734 |
| 7,714,452 B2 * | 5/2010 | Clevenger et al. .......... | 257/786 |
| 2008/0018423 A1 * | 1/2008 | Matsui et al. ............... | 335/126 |

* cited by examiner

*Primary Examiner*—Chris Chu

(57) ABSTRACT

Structures, methods, and systems for assessing bonding of electrodes in FCB packaging are disclosed. In one embodiment, a method comprises mounting a semiconductor chip with a plurality of first electrodes of a first shape to a mounted portion with a second electrode of a second shape, wherein the second shape is different from the first shape, bonding a respective one of the plurality of first electrodes and the second electrode using a first solder bump, generating an X-ray image of the first solder bump, and determining an acceptability of the bonding of the respective one of the plurality of first electrodes and the second electrode based on the X-ray image of the first solder bump.

20 Claims, 10 Drawing Sheets

US 7,816,788 B2

STRUCTURE, METHOD AND SYSTEM FOR ASSESSING BONDING OF ELECTRODES IN FCB PACKAGING

CLAIM OF PRIORITY

This application claims priority from Japanese patent application 2007-130143 filed on May 16, 2007.

FIELD OF TECHNOLOGY

The present invention relates to a semiconductor device, especially the semiconductor device using a flip-chip bonding (FCB) packaging process, and a method for manufacturing thereof.

BACKGROUND

With the miniaturization and sophistication of semiconductor devices, various processes for densely packaging the components have been under development. The FCB may be employed as one of the methods for realizing the dense packaging. During the FCB process of a semiconductor chip, an inner connecting terminal formed of a solder bump is formed on the electrode of the semiconductor chip, and is packaged on a mounted portion, such as an interconnection substrate or another semiconductor chip. The solder bump is thermally processed into a molten state to form a solder ball. It is spread on the electrode surface on the mounted portion and solidified to become the solder bump again. The electrode on the semiconductor chip and the electrode on the mounted portion are thus physically and electrically coupled with each other via the solder bump.

In order to suppress the risk of producing a defective semiconductor device, an inspection to confirm whether the electrode and the solder bump are appropriately bonded needs to be conducted promptly. As the bonded portion between the electrode and the solder bump is hidden behind the semiconductor chip with the flip-chip structure, a mere visual inspection may not be enough to confirm the workmanship of the bonded portion. That may be the reason why an X-ray image pick-up or an electrical continuity test is performed on the subject area.

During the X-ray image pick-up, the determination with respect to the acceptability of the bonded state is made based on the relative positional relationship between the solder bump and the electrode on the mounted portion picked up by the X-ray. In the case where the electrode on the mounted portion is considerably thin, only the image of the solder bump without the image of the electrode is picked up by the X-ray. In this case, it may be difficult to confirm the bonded state from the X-ray image picked up from the top. So the image pick-up is required to be performed diagonally or laterally using a high magnification X-ray device. The aforementioned inspection process requires not only an expensive X-ray device but also relatively long inspection time. Furthermore, the prolonged inspection process may make it difficult or useless to perform an inspection for confirming the electric continuity of the bonded portion.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a semiconductor device comprising a semiconductor chip, a plurality of first electrodes of a first shape formed on a bottom surface of the semiconductor chip, a mounted portion having the semiconductor chip mounted thereon, a second electrode of a second shape formed on a top surface of the mounted portion, wherein the second shape is different from the first shape, and a first solder bump for bonding a respective one of the plurality of first electrodes and the second electrode, wherein the first solder bump covers entire surfaces of the respective one of the plurality of first electrodes and the second electrode.

Another embodiment described in the detailed description is directed to a method for manufacturing a semiconductor device comprising mounting a semiconductor chip with a plurality of first electrodes of a first shape to a mounted portion with a second electrode of a second shape, wherein the second shape is different from the first shape, bonding a respective one of the plurality of first electrodes and the second electrode using a first solder bump, generating an X-ray image of the first solder bump, and determining an acceptability of the bonding of the respective one of the plurality of first electrodes and the second electrode based on the X-ray image of the first solder bump.

Yet another embodiment described in the detailed description is directed to a semiconductor manufacturing system comprising a solder bump bonding section for bonding a respective one of a plurality of first electrodes of a first shape formed on a bottom surface of a semiconductor chip to a second electrode of a second shape formed on a mounted portion using a first solder bump, wherein the first shape is different from the second shape, an X-ray image pick-up section for generating an X-ray image of the first solder bump, and a control unit for determining acceptability of the bonding based on the X-ray image.

As illustrated in the detailed description, other embodiments pertain to structures, methods, and systems that enable inspection of bonding of electrodes on a mounting portion or a mounted portion faster and in simpler steps. By forming solder bumps on the mounting portion and/or mounted portion in different shapes, different X-ray images of the solder bumps can be generated. By comparing the X-ray images with their respective reference images, adequacy of the bonding of electrodes can be determined.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments enable inspection of bonding of electrodes in a mounting portion and a mounted portion faster and in simpler steps. By forming solder bumps on the mounting portion and/or mounted portion in different shapes, different X-ray images of the solder bumps can be obtained. Adequacy of the bonding of electrodes can be assessed by comparing the X-ray images with their respective reference images.

First Embodiment

The first embodiment pertains to a chip-on-chip type semiconductor device which uses a semiconductor chip as a mounted portion. In FIGS. 1 through 4, a method for manufacturing a semiconductor device according to the first embodiment is described.

Figure 1A:
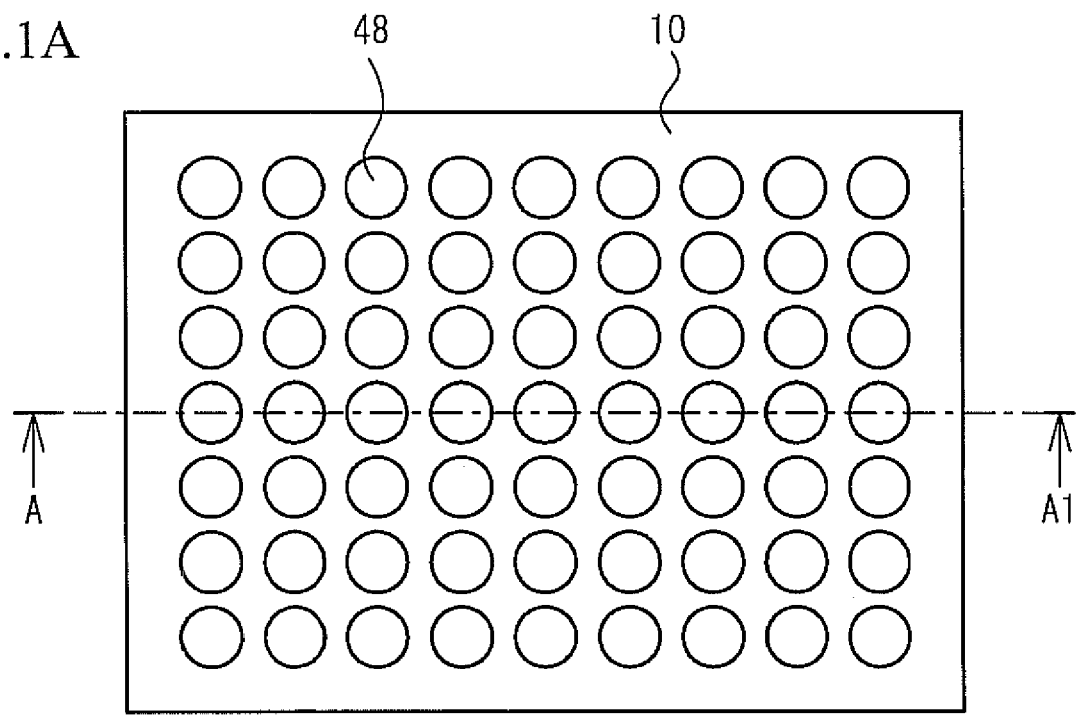
FIG. 1A is the bottom view of an exemplary semiconductor chip as a mounting portion, according to the first embodiment.
Figure 1B:
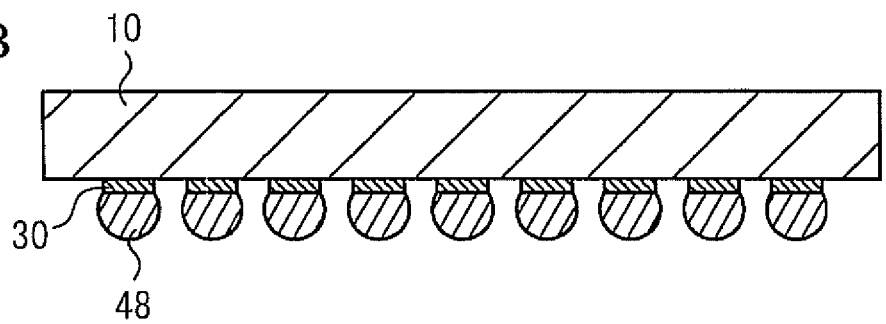
FIG. 1B is a cross sectional view taken along line A-A1 shown in FIG. 1A, according to the first embodiment.

FIG. 1A is the bottom view of an exemplary semiconductor chip 10 as a mounting portion, according to the first embodiment. FIG. 1B is a cross sectional view taken along line A-A1 shown in FIG. 1A, according to the first embodiment. In FIG. 1B, first electrodes 30 each formed of copper for drawing interconnections outward are formed on a main surface of the semiconductor chip 10 formed of silicon. Solder balls 48 each formed of tin and silver are formed on the surface of the first electrodes 30 for physically and electrically coupling the semiconductor chip 10 to an external device. The first electrode 30 seen from the top is a circular shape. After the solder ball 48 is heated and melted in steps which will be described later, the solder ball 48 is formed into a substantially semi-spherical shape owing to the surface tension. Owing to the circular shape of the electrode, the wetting property with respect to the solder may be improved.

Figure 2A:
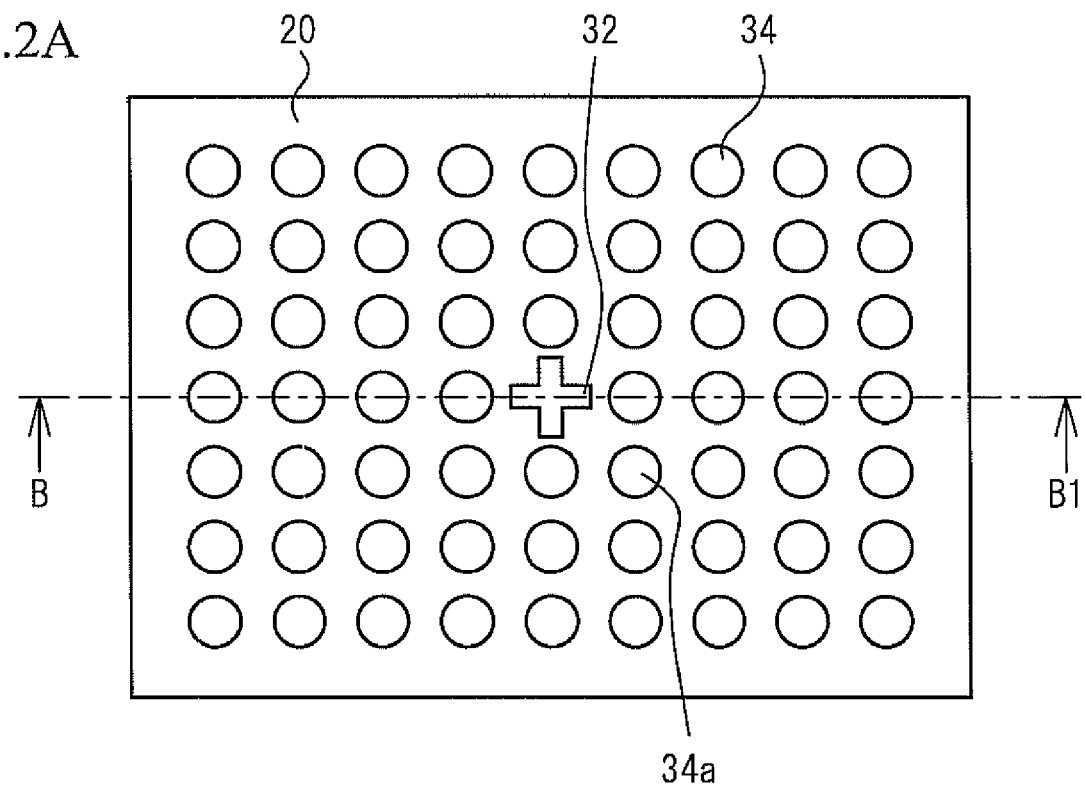
FIG. 2A is the top view of an exemplary semiconductor chip 2 as a mounted portion, according to the first embodiment.
Figure 2B:
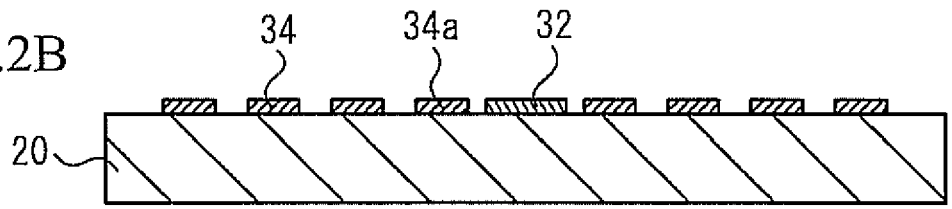
FIG. 2B is a cross sectional view taken along line B-B1 shown in FIG. 2A, according to the first embodiment.

FIG. 2A is the top view of an exemplary semiconductor chip 20 as a mounted portion, according to the first embodiment. FIG. 2B is a cross sectional view taken along line B-B1 shown in FIG. 2A, according to the first embodiment. Referring to FIG. 2A, a second electrode 32 is formed at the center of the second semiconductor chip 20 while being surrounded with a third electrodes 34. In the first embodiment, the second electrode 32 is arranged to be surrounded with eight third electrodes 34a as shown in FIG. 2A. As the electrode receives the thermal stress in the overheating molten step of the solder ball or in the resin sealing step upon packaging of the semiconductor chip to be described later, the outer side influenced by the thermal stress significantly is provided with the circular third electrodes 34 with high thermal stress resistance. Then, the inner side influenced by the thermal stress less significantly is provided with the cross-shaped second electrode 32 with low thermal stress resistance. Preferably, the second electrode 32 is provided at the center of the semiconductor chip 20 as the mounted portion. This makes it possible to further suppress the thermal stress exerted to the second electrode 32.

Figure 3:
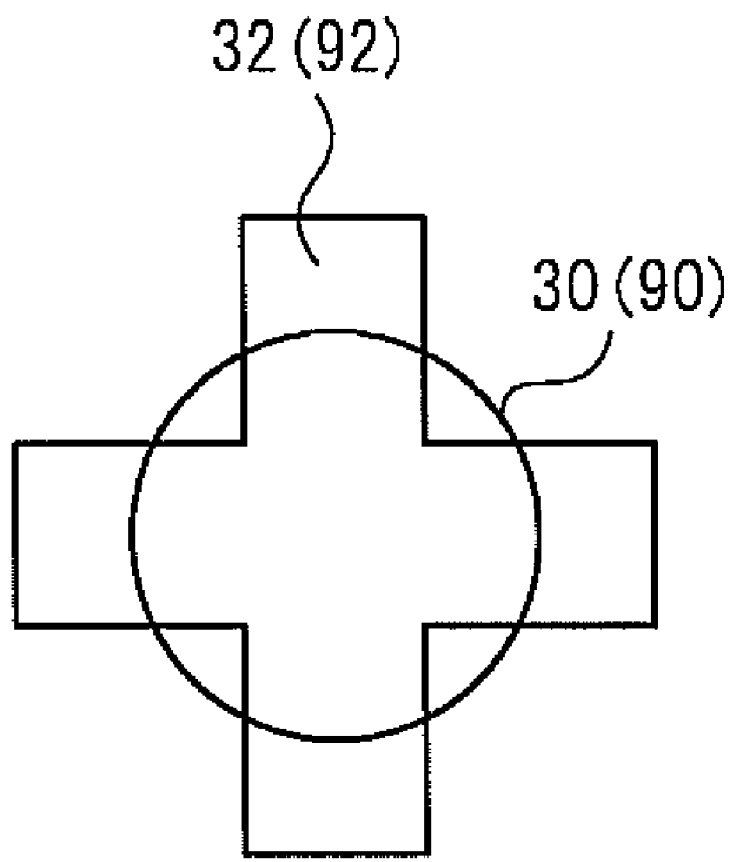
FIG. 3 is a perspective view which superimposes the first electrode and the second electrode, according to the first embodiment.

FIG. 3 is a perspective view which superimposes the first electrode and the second electrode, according to the first embodiment. The second electrode 32 formed of copper for the X-ray inspection and the third electrodes 34 each formed of copper for drawing interconnections outward from the second semiconductor chip 20 (mounted portion) formed of silicon are formed on the main surface thereof. The flux (not shown) for enhancing the wetting property with respect to the solder is applied to each surface of the second electrode 32 and the third electrodes 34. The second electrode 32 seen from the top is a cross-shape which is different from the shape of the first electrode 30. In FIG. 3, when the first electrode 30 and the second electrode 32 are superimposed, the second electrode 32 partially protrudes from the first electrode 30. The planar shape of the third electrode 34 seen from the top is a circular shape which is the same as the first shape 90. The aforementioned shape is determined in consideration with the wetting property with respect to the solder in the same case as that of the first electrode 30.

Figure 4:
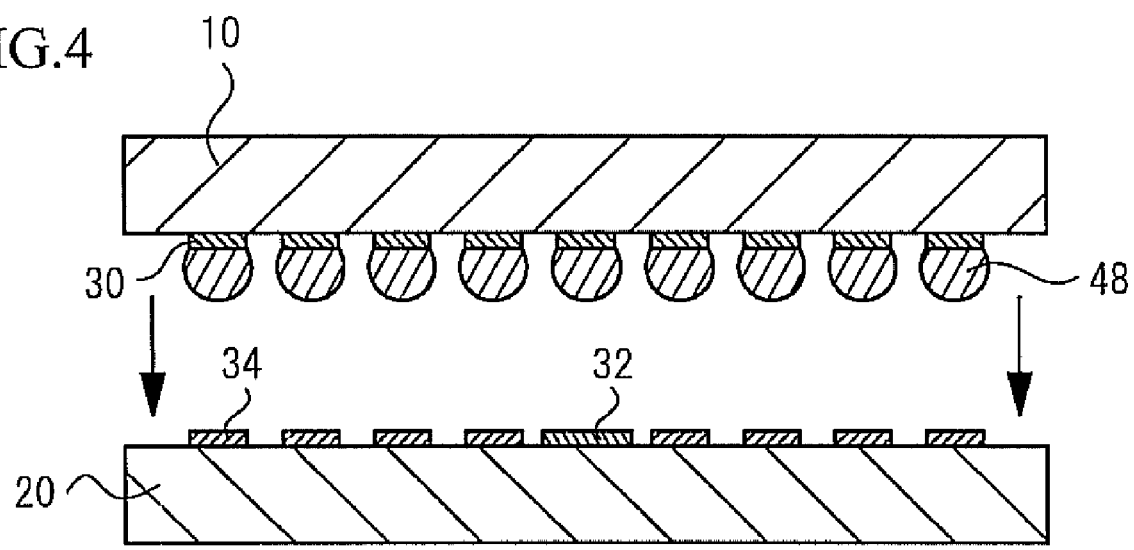
FIG. 4 shows a bonding process of two semiconductor chips according to the first embodiment.

FIG. 4 shows a bonding process of two semiconductor chips according to the first embodiment. Referring to FIG. 4, the first semiconductor chip 10 is mounted on the second semiconductor chip 20 through the flip-chip bonding process. Firstly, the solder ball 48 is heated to be in a molten state. Then the first, second and third electrodes 30, 32 and 34 are positioned to fuse the solder balls 48 with the second and third electrodes 32 and 34. As the flux is applied to surfaces of the second and the third electrodes 32 and 34, the solder ball 48 in the sufficient molten state may cover the entire surfaces of the second and the third electrodes 32 and 34. When the solder ball 48 is solidified, a first solder bump 40 is formed between the first and the second electrodes 30 and 32, and a second solder bump 42 is formed between the first and the third electrodes 30 and 34, respectively. The semiconductor device 1 according to the first embodiment may be completed in the solder bump bonding step as described above.

Figure 5:
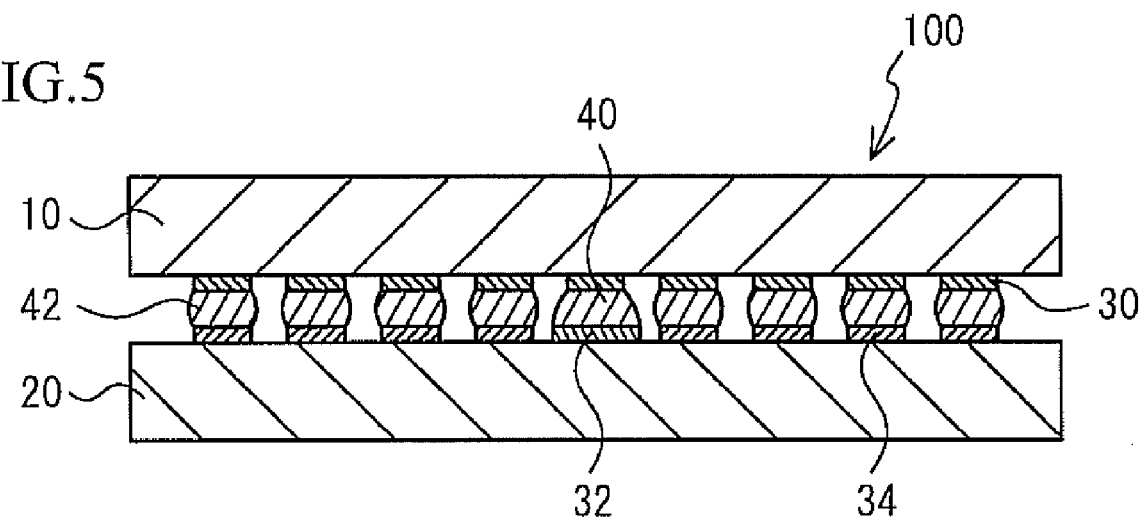
FIG. 5 is a cross sectional view of a semiconductor device according to the first embodiment.

FIG. 5 is a cross sectional view of a semiconductor device 100 according to the first embodiment. The first electrodes 30 each having a circular shape (e.g., a first shape 90 in FIG. 3) are formed on the main surface of the first semiconductor chip 10. The second electrode 32 with a cross-like shape (e.g., a second shape 92 in FIG. 3) is formed on the center of the second semiconductor chip 20 as the mounted portion. The third electrodes 34 each with a circular shape which is similar to the first shape 90 surround the periphery of the second electrode 32. The first electrode 30 and the second electrode 32 are bonded via the first solder bump 40. The first electrode 30 and the third electrode 34 are bonded via the second solder bump 42. The first solder bump 40 covers the entire surface of the second electrode 32. Subsequent to the solder bump bonding step, the semiconductor device 100 is inspected using an X-ray. Specifically, the bonded portion between the first solder bump 40 and the second electrode 32 is inspected by the X-ray. When the bonded portion is formed satisfactorily, the semiconductor device 100 is determined as acceptable.

Figure 6:
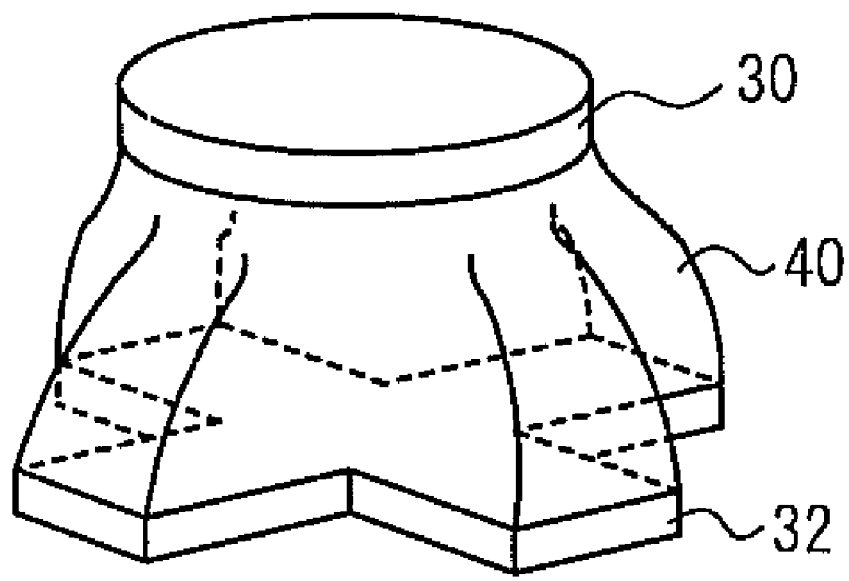
FIG. 6 is a perspective view showing a good bonded portion between the first solder bump and the second electrode.

FIG. 6 is a perspective view showing a good bonded portion between the first solder bump 40 and the second electrode 32. In the semiconductor device 100 according to the first embodiment, the first electrode 30 and the second electrode 32 have different shapes. Accordingly, the upper shape, which is the bonded portion with the first electrode 30, and the lower shape, which is the bonded portion with the second electrode 32, of the first solder bump 40 are different. In FIG. 6, the upper shape takes after the first shape 90 which is the same as that of the first electrode 30, and the lower shape takes after the second shape 92 which is the same as that of the second electrode 32. On the other hand, when the first solder bump 40 fails to sufficiently cover the surface of the second electrode, the semiconductor device 100 fails the inspection. Since the first electrode 30 and the second electrode 32 have different shapes, the inspection regarding the bonded state of the two electrodes can be made by inspecting the shape of the first solder bump 40 even if the images of the two electrodes cannot be obtained by the X-ray. This makes it possible to conduct the X-ray inspection of the bonded portion in quick, simple steps.

Referring to FIG. 3, when the first and the second shapes 90 and 92 are superimposed, the second shape 92 partially protrudes from the first shape. The X-ray inspection is conducted from the direction vertical to the electrode to determine the acceptability of the bonded state based on the shape of the first solder bump 40. The determination with respect to the acceptability of the bonded state may be made based on the state whether or not the entire surface of the second electrode 32 is covered with the first solder bump 40. For example, in the case where the shading of the X-ray image of the second electrode 32 which is vertically picked up by the X-ray is the same as the second shape 92, the entire surface of the second electrode 32 is covered with the first solder bump 40. Accordingly the semiconductor device is determined as acceptable. In the aforementioned method, only observation of the bonded portion between the first solder bump 40 and the second electrode 32 may be required.

Referring to FIG. 2A, the second semiconductor chip 20 as the mounted portion includes the second and the third electrodes 32 and 34 each having different shapes. The determination with respect to the acceptability of the bonded state may be made based on the state whether or not the first solder bump 40 and the second solder bump 42 bonded to those electrodes have different shapes. For example, the electrode image may be vertically picked up by the X-ray for the purpose of confirming the difference in the shape in the fully clarified manner. If the resultant shadings are different, a semiconductor device is determined as acceptable. If the shape of the second electrode 32 and the shape of the third electrode 34 are found to be different, the bonded portion of the semiconductor device 100 passes the test.

In the aforementioned method, the vertical electrode images obtained by the X-ray may be more simple and quick to analyze the state of the bonded portion. Accordingly, such an X-ray inspection may be conducted immediately after the solder bump bonding step at an early stage of the manufacturing. This may in turn make the manufacturing process of the semiconductor device 100 more productive, less wasteful, and higher yielding.

Second Embodiment

Figure 7A:
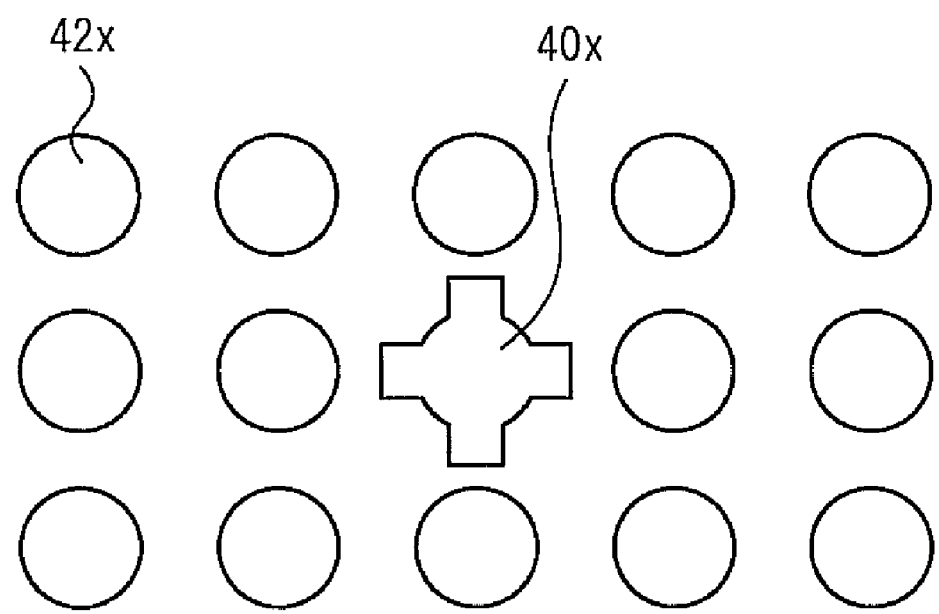
FIGS. 7A and 7B illustrate top views of X-ray images of a semiconductor device, according to the second embodiment.
Figure 7B:
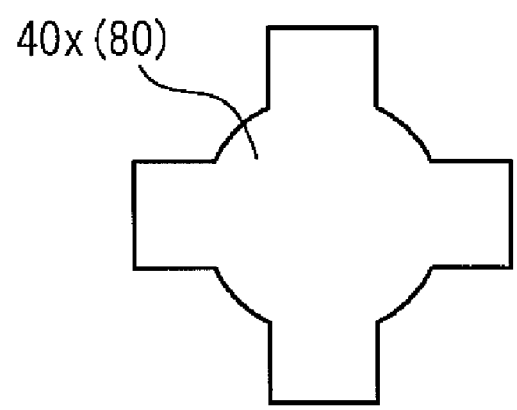

In the second embodiment, the shading of an X-rayed image is compared with a preference to determine acceptability of the bonded state. The structure of the semiconductor device 100 for the X-ray inspection is the same in the second embodiment as the one in the first embodiment. FIGS. 7A and 7B illustrate top views of X-ray images of a semiconductor device, according to the second embodiment. Each of FIGS. 7A and 7B shows the image obtained by irradiating the X-ray to the semiconductor device 100 shown in FIG. 5 in the direction vertical to the first and the second electrodes 30 and 32. As each of the first and the second electrodes 30 and 32 is as thin as approximately 1 um, a shading 40x of the first solder bump 40 and a shading 42x of the second solder bump 42 only appear on the X-ray pick-up image. The shape of the shading of the first solder bump 40 in the good bonded state shown in FIG. 7B will be designated as a first reference shape 80.

The first reference shape 80 corresponds with the shape derived from superimposing the first shape 90 and the second shape 92. As the bonded portion between the first solder bump 40 and the first electrode 30 has the circular shape (first shape 90), and the bonded portion between the first solder bump 40 and the second electrode 32 has the cross-shape (second shape 92), the shading 40x of the first solder bump 40 is formed to have the cross-shape protruding from the circular shape as shown in FIG. 7B. The shape similar to the one shown in FIG. 7B, or the shading of the diagonal image may be used as the first reference shape 80.

In the X-ray inspection step, the shape of the shading 40x of the first solder bump 40 is compared with the first reference shape 80. If they are the same, or they are matched with a predetermined matching ratio or higher, the semiconductor device 100 is determined as acceptable. The X-ray inspection process according to the second embodiment allows inspection of the bonded state using an X-ray device with a relatively low resolution.

Third Embodiment

Figure 8A:
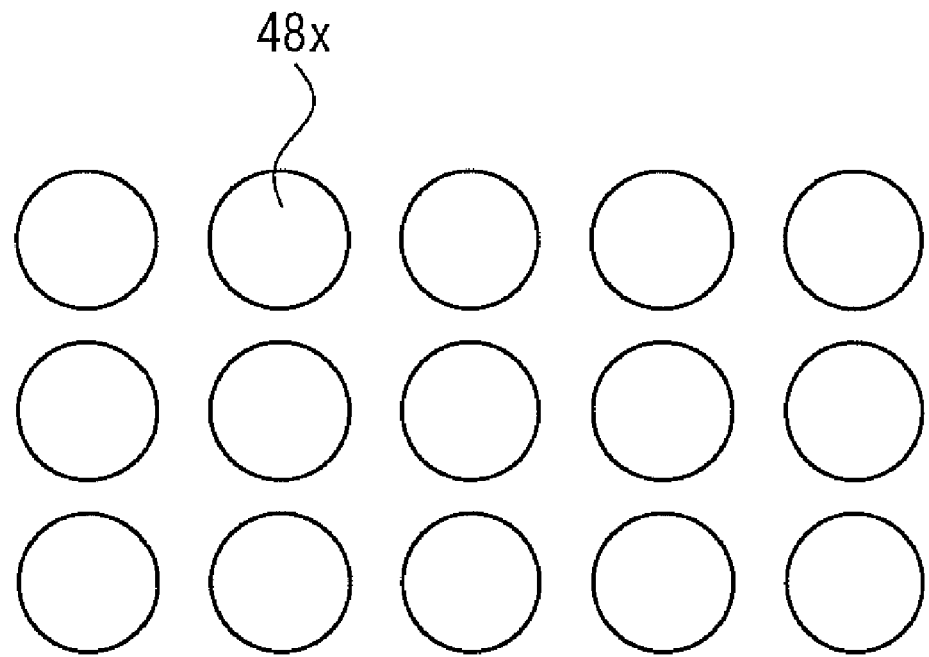
FIGS. 8A and 8B illustrate top views of X-ray images of a semiconductor device prior to a solder bump bonding, according to the third embodiment.
Figure 8B:
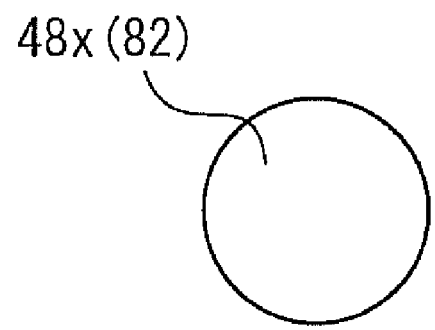

In the third embodiment, the shading of the solder ball prior to bonding of the solder bump is used as the reference shape. It is appreciated that the structure of the semiconductor device 100 for the X-ray inspection is the same as that of the first embodiment. FIG. 1B is a sectional view of the first semiconductor chip 10 prior to the solder bump bonding. FIGS. 8A and 8B illustrate top views of X-ray images of a semiconductor device prior to a solder bump bonding, according to the third embodiment. Each of FIGS. 8A and 8B shows the image picked up by irradiating the X-ray to the first semiconductor chip 10 prior to the solder bump bonding in the direction vertical to the first electrode 30. As the first electrode 30 is as thin as approximately 1 um, only the shading 48x of the solder ball 48 may appear on the X-ray pick-up image. The shape shown in FIG. 8B is used as a second reference shape 82.

The second reference shape 82 corresponds with the shape of the solder ball 48. That is, as the solder ball 48 is substantially spherical, the resultant shading 48x becomes circular. The diameter of the shading is the same as that of the solder ball 48. The shape similar to the one shown in FIG. 8B, or the shading of the diagonally picked up image may be used as the second reference shape. In the X-ray inspection step, the shading 40x of the first solder bump 40 is compared with the second reference shape 82. If they are different (for example, the cross-shape protrudes from the shading of the solder ball shown in FIG. 7B), it may be determined as acceptable.

As the determination according to the third embodiment, is made based on the state whether or not the protruding portion exists without using the matching ratio, the data used for the image processing may be less than those for the determination process in the second embodiment. In the second and the third embodiments, the X-ray imaging is performed from a direction vertical to the electrode. However, it is appreciated that the imaging can be performed diagonally or horizontally.

Fourth Embodiment

Figure 9:
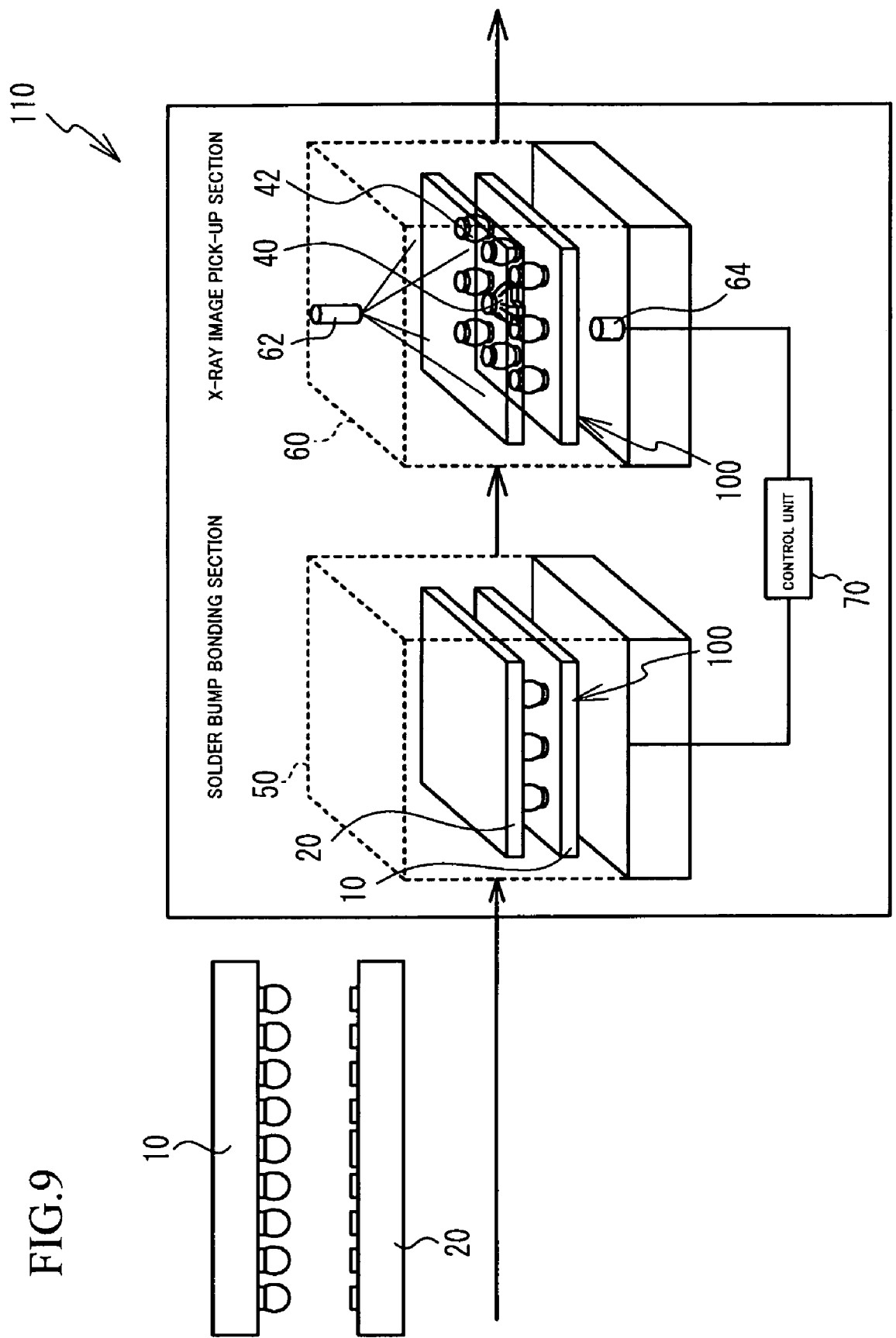
FIG. 9 is a schematic diagram of an exemplary system for performing and inspecting bonding, according to the fourth embodiment.

The fourth embodiment provides a system for manufacturing the semiconductor device illustrated in the first embodiment. FIG. 9 is a schematic diagram of an exemplary system 110 for performing and inspecting bonding, according to the fourth embodiment. The semiconductor manufacturing system 110 is formed of a solder bump bonding section 50, an X-ray image pick-up section 60, and a control unit 70 for controlling the two sections. The solder bump bonding section 50 is formed of a flip-chip bonder (not shown). The X-ray image pick-up section 60 is formed of an X-ray irradiation unit 62 and an X-ray receiving unit 64. The solder bump bonding section 50 and the X-ray receiving unit 64 are connected to the control unit 70. The X-ray image pick-up section 60 shows the semiconductor device 100 with the first solder bump 40 and the second solder bump 42. The same structures as those in the first and the second embodiments will be designated with the same reference numerals hereinafter.

The solder bump bonding section 50 bonds the first semiconductor chip 10 provided with the first electrode 30 having the first shape 90 to the second semiconductor chip 20 as the mounted portion provided with the second electrode 32 having the second shape 92, which is different from the first shape 90, via the first solder bump 40. The first solder bump 40 is formed from the solder ball 48 on the surface of the first electrode 30. The third electrode 34 provided on the second semiconductor chip 20 as the mounted portion is bonded to the first electrode 30 via the second solder bump 42. The X-ray image pick-up section 60 picks up the X-ray image of the first solder bump 42. The control unit 70 determines the acceptability of the bonded state between the first solder bump 40 and the second electrode 32 based on the image picked up by the X-ray image pick-up section 60.

Figure 10:
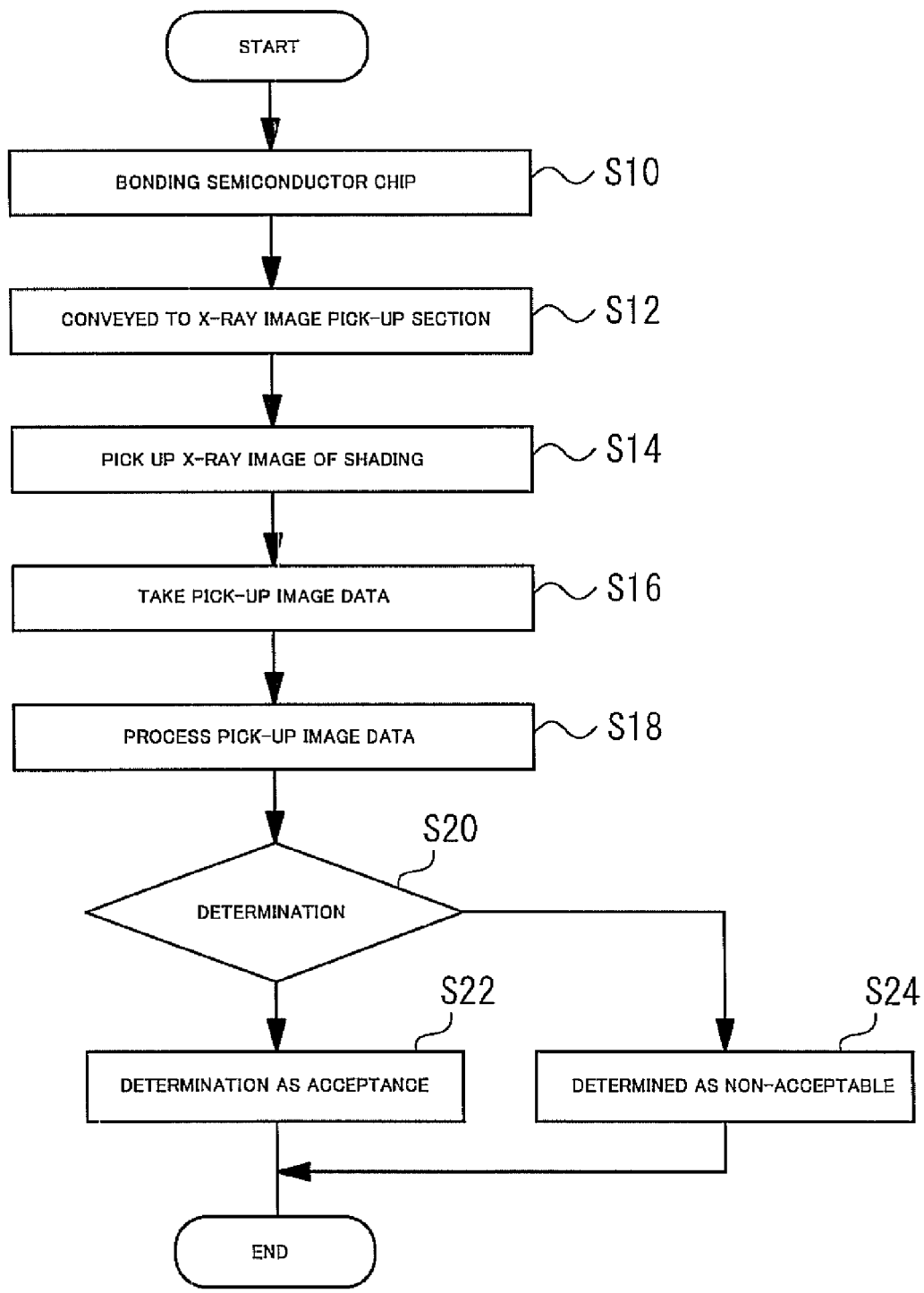
FIG. 10 is a flowchart of an exemplary method for performing and inspecting bonding, according to the fourth embodiment.

FIG. 10 is a flowchart of an exemplary method for performing and inspecting bonding, according to the fourth embodiment. The operation of the semiconductor manufacturing system 110 will be described referring to both FIGS. 9 and 10. First in step S10, the control unit 70 causes the solder bump bonding section 50 to bond the first and the second semiconductor chips 10 and 20 via the first solder bump 40 (not shown) and the second solder bump 42. As a result, the semiconductor device 100 according to the first embodiment is completed. Then in step S12, the control unit 70 allows the conveyance unit (not shown) to convey the semiconductor device 100 to the X-ray image pick-up section 60.

In step S14, the control unit 70 causes the X-ray irradiation unit 62 to irradiate an X-ray to the semiconductor device 100. The X-ray which has transmitted through the semiconductor device 100 are received by the X-ray receiving unit 64, and converted into an electrical signal. Then in step S16, the control unit 70 converts the electric signal received from the X-ray receiving unit 64 into image data. In step S18, the control unit 70 modifies the image data to suitable for determining acceptability of the bonding.

In step S20, the control unit 70 makes the decision as to whether the bonding is acceptable. It is appreciated that the decision may be based on any one of the first to the third embodiments. In the case where the bonded state is satisfactory, the control unit 70 determines that the semiconductor device 100 is acceptable in step S22. In the case where the bonded state is not satisfactory, the control unit 70 determines that the semiconductor device 100 is not acceptable in step S24.

In the case where the first solder bump 40 covers the entire surface of the second electrode 32, the control unit 70 may determine that the semiconductor device 100 is acceptable. In the case where the first solder bump 40 has the shape different from that of the second solder bump 42, the control unit 70 may determine that the semiconductor device 100 is acceptable. In the case where the shading of the X-ray pick-up image of the first solder bump 40 has the same shape as the first reference shape 80 corresponding to the shape formed by superimposing the first and the second shapes 90 and 92, the control unit 70 may determine that the semiconductor device 100 is acceptable. In the case where the shading of the X-ray pick-up image of the first solder bump 40 has the shape different from the second reference shape 82 corresponding to the solder ball 48, the control unit 70 may determine that the semiconductor device 100 is acceptable.

In the semiconductor manufacturing system 110 according to the fourth embodiment, the shape of the first electrode 30 on the first semiconductor chip 10 is different from that of the second electrode 32 on the second semiconductor chip 20 bonded to the first semiconductor chip 10 by the solder bump bonding section 50. The determination with respect to the acceptability of the bonded state may be made easy by the control unit 70 based on the shading of the X-ray image of the first solder bump 40 picked up by the X-ray image pick-up section 60. As the X-ray image pick-up section 60 is disposed closely in the downstream of the solder bump bonding section 50, the acceptability of the bonded state may be monitored in real time through the control unit 70. This may make it possible to eliminate defective semiconductor devices from the production line in an early production stage, thus achieving high yield at low cost.

In the first through the fourth embodiments, the second semiconductor chip 20 is employed as the mounted portion. However, an interposer may be employed as the mounted portion where the semiconductor chip is mounted on the interposer through the FCB. When the electrode is formed on the interposer, the electrode may be made thicker (several tens of um) compared with the formation of the electrode on the semiconductor chip. In this case, the X-ray images of both the electrode and the solder bump may be obtained, which makes it possible to determine the acceptability of the bonded state through the generally employed process. As the shape of the second electrode 32 on the mounted portion is made different from that of the first electrode 30 on the semiconductor chip as described in the first embodiment, the determination with respect to the acceptability of the bonded state may be made based on the shape of the solder bump for bonding the first electrode 30 and the second electrode 32.

In the first through the fourth embodiments, the second electrode 32 has the cross-shaped (e.g., second shape 92). However, it may be formed in any shape (e.g., square, rectangular, oval, star, and other shapes) so long as it is different from the shape of the first electrode 30 (e.g., first shape 90). Preferably, when the first shape 90 and the second shape 92 are superimposed, the second shape 92 at least partially protrudes from the first shape 90. This makes it possible to confirm the bonded state even by the X-ray image pick-up in the direction vertical to the electrode.

In the first through the fourth embodiments, preferably, the surface area of the second electrode 32 is substantially same as that of the third electrode 34. Supposing that the solder balls each having the same volume are formed on the electrode, it is preferable to make the height of each solder ball equal. In FIG. 4, the respective heights of the first and the second solder bumps 40 and 42 formed from the solder ball 48 become equivalent to the height of the solder bump of the electrode with the larger area. Accordingly, if the electrode area becomes excessively different, the resultant solder bump may be irregularly formed. In the first through the fourth embodiments, the solder formed of tin and silver is employed as the first solder bump 40, the second solder bump 42, and the solder ball 48. However, the solder may be formed using different combinations of metals. For example, a combination of tin, silver, and copper or tin and lead may be used as an alloy which turns into a molten state at the predetermined temperature (so as not to damage the loaded components including the first semiconductor chip 10, for example, 235° C. or lower) to bond the metals.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device manufacturing system comprising:
   a solder bump bonding section for bonding a respective one of a plurality of first electrodes of a first shape formed on a bottom surface of a semiconductor chip to a second electrode of a second shape formed on a mounted portion using a first solder bump, wherein the first shape is different from the second shape;
   an X-ray image pick-up section for generating an X-ray image of the first solder bump; and
   a control unit for determining acceptability of the bonding based on the X-ray image.

2. The semiconductor device manufacturing system of claim 1, wherein the bonding further comprises bonding a respective one of a plurality of third electrodes of a third shape formed on the mounted portion with a respective one of the plurality of first electrodes using a second solder bump, wherein the third shape is different from the second shape.

3. The semiconductor device manufacturing system according to claim 2, wherein the generating the X-ray image further comprises generating an X-ray image of the second solder bump.

4. The semiconductor device manufacturing system according to claim 2, wherein the second electrode is surrounded by the plurality of third electrodes.

5. The semiconductor device manufacturing system according to claim 1, wherein the second shape protrudes at least partially from the first shape.

6. The semiconductor device manufacturing system according to claim 1, wherein the mounted portion comprises an interposer.

7. The semiconductor device manufacturing system according to claim 1, wherein the X-ray image pick-up section comprises an X-ray irradiation unit for irradiating X-rays to the semiconductor device and an X-ray receiving unit for processing the X-rays to generate an X-ray image.

8. The semiconductor device manufacturing system according to claim 7, wherein the X-ray image is modified for determining the acceptability of the bonding.

9. The semiconductor device manufacturing system according to claim 1, wherein the mounted portion comprises one of an interconnection substrate and a second semiconductor chip.

10. The semiconductor device manufacturing system according to claim 1, wherein the second shape comprises a cross and the first shape and the third shape comprise a circle.

11. A semiconductor device manufacturing system comprising:
    a means for bonding a respective one of a plurality of first electrodes of a first shape formed on a bottom surface of a semiconductor chip to a second electrode of a second shape formed on a mounted portion using a first solder bump, wherein the first shape is different from the second shape;
    a means for generating an X-ray image of the first solder bump; and
    a means for determining acceptability of the bonding based on the X-ray image.

12. The semiconductor device manufacturing system of claim 11, wherein the bonding further comprises bonding a respective one of a plurality of third electrodes of a third shape formed on the mounted portion with a respective one of the plurality of first electrodes using a second solder bump, wherein the third shape is different from the second shape.

13. The semiconductor device manufacturing system according to claim 12, wherein the generating the X-ray image further comprises generating an X-ray image of the second solder bump.

14. The semiconductor manufacturing system according to claim 12, wherein the second electrode is surrounded by the plurality of third electrodes.

15. The semiconductor device manufacturing system according to claim 11, wherein the second shape protrudes at least partially from the first shape.

16. The semiconductor device manufacturing system according to claim 11, wherein the mounted portion comprises an interposer.

17. The semiconductor device manufacturing system according to claim 11, wherein the means for generating an X-ray image comprises an X-ray irradiation unit for irradiating X-rays to the semiconductor device and an X-ray receiving unit for processing the X-rays to generate an X-ray image.

18. The semiconductor device manufacturing system according to claim 17, wherein the X-ray image is modified for determining the acceptability of the bonding.

19. The semiconductor manufacturing system according to claim 11, wherein the mounted portion comprises one of an interconnection substrate and a second semiconductor chip.

20. The semiconductor manufacturing system according to claim 11, wherein the second shape comprises a cross and the first shape and the third shape comprise a circle.

* * * * *